(12) United States Patent
Sunaga et al.

(10) Patent No.: US 9,312,234 B2
(45) Date of Patent: Apr. 12, 2016

(54) SEMICONDUCTOR MODULE AND METHOD FOR MANUFACTURING THE SAME

(71) Applicant: NSK Ltd., Shinagawa-ku, Tokyo (JP)

(72) Inventors: Takashi Sunaga, Tokyo (JP); Noboru Kaneko, Tokyo (JP); Osamu Miyoshi, Tokyo (JP)

(73) Assignee: NSK Ltd., Tokyo (JP)

( * ) Notice: Subject to any disclaimer, the term of this patent is extended or adjusted under 35 U.S.C. 154(b) by 0 days.

(21) Appl. No.: 14/127,187

(22) PCT Filed: May 27, 2013

(86) PCT No.: PCT/JP2013/003332
§ 371 (c)(1),
(2) Date: Dec. 18, 2013

(87) PCT Pub. No.: WO2013/179638
PCT Pub. Date: Dec. 5, 2013

(65) Prior Publication Data
US 2015/0076570 A1 Mar. 19, 2015

(30) Foreign Application Priority Data

May 29, 2012 (JP) ................................. 2012-122327
Nov. 5, 2012 (JP) ................................. 2012-243682

(51) Int. Cl.
*H01L 29/76* (2006.01)
*H01L 23/00* (2006.01)
(Continued)

(52) U.S. Cl.
CPC ................ *H01L 24/43* (2013.01); *H01L 24/37* (2013.01); *H01L 24/41* (2013.01); *H01L 24/49* (2013.01);
(Continued)

(58) Field of Classification Search
CPC ... H01L 23/49513; H01L 23/43; H01L 24/49; H01L 24/85; H01L 29/78; H01L 24/83; H01L 24/37; H01L 25/072; H01L 24/92; H01L 24/84; H01L 25/07; H01L 25/18; H01L 2924/00014; H01L 2224/451; H01L 2924/01029; H01L 2924/3701; H01L 2924/13091; H01L 2224/43848; H01L 2224/494; H01L 2224/85815; H01L 2924/351; H01L 2924/1305; H01L 2924/13055; H01L 2924/1306; H01L 2924/014; H01L 2224/8321; H01L 2224/32238; H01L 2224/4103; H01L 2924/19105; H01L 2224/83447; H01L 2224/85; H01L 2224/83191; H01L 24/40; H01L 2224/33181; H01L 2224/84815; H01L 24/35; H01L 2224/9221; H01L 2224/40475; H01L 2224/291; H01L 2224/3701; H01L 2224/40227; H01L 24/73; H01L 2224/83424; H01L 2224/83192; H01L 2224/84424; H01L 2224/48; H01L 24/29; H01L 24/32; H01L 2224/32227; H01L 2224/83815; H01L 2224/4112; H01L 2224/352; H01L 2224/84447; H01L 2224/37147; H01L 2224/40499; H01L 2224/293; H01L 2224/73263; H01L 24/33; H01L 2224/35847; H01L 2224/37013; H01L 2224/29294; H01L 2924/3011; H01L 23/3735; H01L 23/49811
USPC .................................. 257/288, 693, E21.504
See application file for complete search history.

(56) References Cited

U.S. PATENT DOCUMENTS 7,719,100 B2 * 5/2010 Yamashita et al. ............ 257/692
(Continued)

FOREIGN PATENT DOCUMENTS

JP     3-195053 A     8/1991
(Continued)

OTHER PUBLICATIONS

International Preliminary Report on Patentability (PCT/IB/338 & PCT/IB/373) dated Dec. 11, 2014, including English translation of Document C2 (Japanese-language Written Opinion (PCT/ISA/237)) previously filed on Dec. 18, 2013 (six (6) pages.
(Continued)

*Primary Examiner* — Victor A Mandala
(74) *Attorney, Agent, or Firm* — Crowell & Moring LLP

(57) ABSTRACT

There is provided a semiconductor module and a method for manufacturing the same which make it possible to joint the electrode of the bare-chip transistor and the wiring pattern on the substrate by solder mounting operation, in the same process of solder mounting operation for mounting the bare-chip transistor or other surface mounting devices on the wiring patterns on the substrate. A semiconductor module includes: a plurality of wiring patterns formed on an insulating layer; a bare-chip transistor mounted on one wiring pattern out of the plurality of wiring patterns via a solder; and a copper connector constituted of a copper plate for jointing an electrode formed on a top surface of the bare-chip transistor and another wiring pattern out of the plurality of wiring patterns via a solder.

5 Claims, 9 Drawing Sheets

(51) Int. Cl.
H01L 25/07 (2006.01)
H01L 25/18 (2006.01)
H01L 29/78 (2006.01)
H01L 23/373 (2006.01)
H01L 23/498 (2006.01)

(52) U.S. Cl.
CPC ............... H01L 24/83 (2013.01); H01L 24/84 (2013.01); H01L 24/85 (2013.01); H01L 24/92 (2013.01); H01L 25/07 (2013.01); H01L 25/072 (2013.01); H01L 25/18 (2013.01); H01L 29/78 (2013.01); H01L 23/3735 (2013.01); H01L 23/49811 (2013.01); H01L 24/29 (2013.01); H01L 24/32 (2013.01); H01L 24/33 (2013.01); H01L 24/35 (2013.01); H01L 24/40 (2013.01); H01L 24/73 (2013.01); H01L 2224/291 (2013.01); H01L 2224/293 (2013.01); H01L 2224/29294 (2013.01); H01L 2224/32227 (2013.01); H01L 2224/32238 (2013.01); H01L 2224/33181 (2013.01); H01L 2224/352 (2013.01); H01L 2224/35847 (2013.01); H01L 2224/3701 (2013.01); H01L 2224/37013 (2013.01); H01L 2224/37147 (2013.01); H01L 2224/40095 (2013.01); H01L 2224/40227 (2013.01); H01L 2224/40475 (2013.01); H01L 2224/40499 (2013.01); H01L 2224/4103 (2013.01); H01L 2224/4112 (2013.01); H01L 2224/43848 (2013.01); H01L 2224/451 (2013.01); H01L 2224/48091 (2013.01); H01L 2224/48472 (2013.01); H01L 2224/494 (2013.01); H01L 2224/73263 (2013.01); H01L 2224/73265 (2013.01); H01L 2224/8321 (2013.01); H01L 2224/83191 (2013.01); H01L 2224/83192 (2013.01); H01L 2224/83424 (2013.01); H01L 2224/83447 (2013.01); H01L 2224/83815 (2013.01); H01L 2224/84424 (2013.01); H01L 2224/84447 (2013.01); H01L 2224/84815 (2013.01); H01L 2224/85 (2013.01); H01L 2224/85815 (2013.01); H01L 2224/9221 (2013.01); H01L 2924/00014 (2013.01); H01L 2924/014 (2013.01); H01L 2924/01029 (2013.01); H01L 2924/1305 (2013.01); H01L 2924/1306 (2013.01); H01L 2924/13055 (2013.01); H01L 2924/13091 (2013.01); H01L 2924/19105 (2013.01); H01L 2924/3011 (2013.01); H01L 2924/351 (2013.01); H01L 2924/3701 (2013.01)

(56) References Cited

U.S. PATENT DOCUMENTS

| | | | |
|---|---|---|---|
| 8,836,099 B2* | 9/2014 | Ehrenpfordt | 257/684 |
| 2007/0215999 A1* | 9/2007 | Kashimoto et al. | 257/678 |
| 2008/0230889 A1* | 9/2008 | Standing | 257/693 |
| 2009/0218676 A1* | 9/2009 | Muto et al. | 257/693 |
| 2012/0098138 A1* | 4/2012 | Oka | H01L 21/56 257/773 |
| 2012/0106109 A1* | 5/2012 | Kim | H01L 24/83 361/771 |
| 2012/0138990 A1* | 6/2012 | Sato | H01L 33/641 257/98 |
| 2012/0313232 A1* | 12/2012 | Zhang et al. | 257/676 |
| 2015/0270199 A1* | 9/2015 | Sunaga | H01L 24/37 257/288 |

FOREIGN PATENT DOCUMENTS

| | | | |
|---|---|---|---|
| JP | 6-268027 A | 9/1994 | |
| JP | 10-12812 A | 1/1998 | |
| JP | 2004-335725 A | 11/2004 | |
| JP | 2007-95984 A | 4/2007 | |
| JP | 2009-21395 A | 1/2009 | |
| JP | 2010034350 * | 2/2010 | ............. H01L 21/60 |
| JP | 2010-195219 A | 9/2010 | |

OTHER PUBLICATIONS

International Search Report dated Aug. 27, 2013 with English translation (two (2) pages).
Japanese-language Written Opinion (PCT/ISA/237) dated Aug. 27, 2013 (three (3) pages).
Japanese Office Action dated Mar. 3, 2015, with partial English translation (Six (6) pages).
Japanese Office Action issued in counterpart Japanese Application No. 2014-518275 dated Aug. 11, 2015, with partial English translation (Five (5) pages).

* cited by examiner (PRIOR ART)

SEMICONDUCTOR MODULE AND METHOD FOR MANUFACTURING THE SAME

TECHNICAL FIELD

The present invention relates to a semiconductor module such as a power module incorporated in an automotive electrical equipment, and a method for manufacturing the same.

BACKGROUND ART

In these latter days, electronic apparatuses have been introduced for controlling in various electrical equipment in a vehicle such as an automobile. As an example of the electrical equipment in which an electronic apparatus is incorporated, an electric power steering apparatus is provided with a motor driving unit in an enclosure accommodating an electric motor for steering of the automobile. The electronic apparatus is installed in the motor driving unit. The electronic apparatus is incorporated as the power module in the motor driving unit.

The power module is constituted as a so-called semiconductor module on which a power element such as a field effect transistor (FET) or insulated gate bipolar transistor (IGBT), for example, suitable for controlling an electrical equipment such as the electric power steering apparatus driven by relatively high current. This kind of power module is also called "In-vehicle Module" since it is installed in a vehicle.

As this kind of semiconductor module, a semiconductor module illustrated in FIG. 14 has been known conventionally, for example (see Patent Document 1). FIG. 14 is a cross-sectional schematic view of an example of a conventional semiconductor module.

The semiconductor module 100 illustrated in FIG. 14 is provided with: a substrate 101 made of metal; a resin 102 provided on a bottom flat surface of a recess portion of the substrate 101; and a plurality of copper foils (wiring patterns) 103a, 103b, 103c, and 103d formed on the resin 102. Grooves 109 are formed between the copper foil 103a and the copper foil 103d and between the copper foil 103c and the copper foil 103d. Then, thermal buffer plates 104a and 104b are formed on the copper foils 103a and 103b out of the plurality of copper foils 103a, 103b, 103c, and 103d, respectively. IGBTs 105a and 105b are formed on the buffer plates 104a and 104b, respectively. Each of the IGBTs 105a and 105b is a bare-chip IGBT (bare-chip transistor).

Then, the emitter of the IGBT 105a and the copper foil 103b are jointed to each other by a wiring 106a constituted of a wire, and the emitter of the IGBT 105b and the copper foil 103c are similarly jointed to each other by a wiring 106b constituted of a wire.

Additionally, the resin 102, the copper foils 103a, 103b, and 103c, the buffer plates 104a and 104b, the IGBTs 105a and 105b, and the wirings 106a and 106b are sealed by a gel 107. Additionally, a cover 108 for covering the recess portion of the substrate 101 is fixed at an upper portion of the substrate 101.

As another example of a conventional semiconductor module, a semiconductor module illustrated in FIG. 15 has been also known, for example (see Patent Document 2). FIG. 15 is a plane schematic view of another example of the conventional semiconductor module.

The semiconductor module 200 illustrated in FIG. 15 is provided with a plurality of conductive pads 201 and 202 formed on a substrate (not illustrated). Then, a MOS chip 203 is connected by soldering on one conductive pad 201 out of the plurality of conductive pads 201 and 202. Additionally, a plurality of source electrodes 205 and a single gate electrode 204 are formed on the top surface of the MOS chip 203, and a drain electrode, not illustrated, is formed on the lower surface of the MOS chip 203.

Then, the source electrodes 205 of the MOS chip 203 and another conductive pad 202 out of the plurality of conductive pads 201 and 202 are jointed with each other by a lead 210. The lead 210 is formed by punching and bending a metal plate, and is provided with: a rectangular tabular source electrode jointing portion 211 extending in the X direction and Y direction (horizontal direction) illustrated in FIG. 15; a tabular electrode jointing portion 212 extending in the X direction and Y direction; and a coupling portion 213 coupling the source electrode jointing portion 211 with the electrode jointing portion 212 and tilting in the Z direction (up-down direction). In this situation, the source electrode jointing portion 211 is jointed by soldering with the source electrodes 205 of the MOS chip 203, and the electrode jointing portion 212 is jointed by soldering with the another conductive pad 202 out of the plurality of conductive pads 201 and 202.

The width "a" of the source electrode jointing portion 211 in the X direction is equal to or longer than the width "b" of the plurality of source electrodes 205 in the X direction. This makes it possible to prevent non-uniform solder wetting on the source electrodes 205 and displacement of the source electrodes 205 due to the reflow of the solder.

PRIOR ART DOCUMENTS

Patent Documents

Patent Document 1: JP 2004-335725 A
Patent Document 2: JP 2007-95984 A

SUMMARY OF THE INVENTION

Problem to be Solved

It is to be noted that, however, the conventional semiconductor module 100 illustrated in FIG. 14 and the conventional semiconductor module 200 illustrated in FIG. 15 have following problems.

That is, in the case of the semiconductor module 100 illustrated in FIG. 14, the emitter of the IGBT 105a and the copper foil 103b are jointed to each other by use of the wiring 106a constituted of a wire, and the emitter of the IGBT 105b and the copper foil 103c are jointed to each other by the wiring 106b constituted of a wire. Since the joint using a wire is achieved by use of a wire bonding apparatus (not illustrated), the mounting operation of the wirings 106a and 106b is different from the solder mounting operation for mounting the IGBTs 105a and 105b or the other surface mounting device on the wiring patterns on the substrate. This poses a problem that these operations need different manufacturing processes. When the mounting operation by wire bonding is different from the solder mounting operation and needs a different manufacturing process from that for the solder mounting operation, the manufacturing takt time becomes longer, and in addition, a dedicated equipment is needed for wire bonding. This poses a problem of increasing manufacturing cost.

Additionally, the in the case of the semiconductor module 200 illustrated in FIG. 15, the lead-out direction of the lead 210 jointed to the source electrodes 205 is only the Y direction illustrated in FIG. 15. On the one hand, there is no description regarding the lead jointed to the gate electrode 204. In this situation, when the lead-out direction of the lead 210 jointed to the source electrodes 205 is only one direction, there is no flexibility of arranging the MOS chip 203 mounted on the substrate, and, there is no flexibility of design of wiring on the substrate. This lack of flexibility of design of wiring on the substrate poses a problem that the layout of the semiconductor module on the substrate cannot be compact. Additionally, when the lead-out direction of the lead 210 jointed to the source electrodes 205 is only one direction, there is a problem that it is difficult to uniform length of paths on the substrate for phases of a three-phase motor, this results in variation in the impedance characteristics of the phases and difficulty in conforming characteristics of the phases of a three-phase motor.

Therefore, the present invention has been made to address the above conventional problems, and has an object to provide a semiconductor module and a method for manufacturing the same which make it possible to joint the electrode of the bare-chip transistor and the wiring pattern on the substrate by solder mounting operation, in the same process of solder mounting operation for mounting the bare-chip transistor or other surface mounting devices on the wiring patterns on the substrate.

Additionally, the present invention has another object to provide a semiconductor module and a method for manufacturing the same which make it possible to create flexibility of arranging the bare-chip transistor mounted on the substrate and flexibility of design of wiring on the substrate, to make the layout of the semiconductor module on the substrate compact, and in addition, which make it easy to uniform length of paths on the substrate for phases of a three-phase motor.

Solution to the Problem

In order to achieve the above object, according to an aspect of the present invention, there is provided a semiconductor module comprising: a substrate made of metal; an insulating layer formed on the substrate; a plurality of wiring patterns formed on the insulating layer; a bare-chip transistor mounted on one wiring pattern out of the plurality of wiring patterns via a solder; and a copper connector constituted of a copper plate for jointing an electrode formed on a top surface of the bare-chip transistor and another wiring pattern out of the plurality of wiring patterns via a solder.

According to the above semiconductor module, by using the copper connector constituted of a copper plate, the electrode of the bare-chip transistor and the wiring pattern on the substrate can be jointed by solder mounting operation. Therefore, it is possible to joint the electrode of the bare-chip transistor and the wiring pattern on the substrate in the same process of solder mounting operation for mounting the bare-chip transistor or other surface mounting devices on the wiring patterns on the substrate. This allows to shorten the manufacturing takt time of the semiconductor module, and in addition, eliminates the need for the dedicated equipment for wire bonding, thereby reducing the manufacturing cost of the semiconductor module. That is, it is possible to reduce investment in equipment since the equipment for solder mounting operation can be used for also jointing the electrode of the bare-chip transistor and the wiring pattern on the substrate. Furthermore, it is possible to perform the process for mounting the bare-chip transistor or other surface mounting devices on the wiring patterns on the substrate and the process for jointing the electrode of the bare-chip transistor and the wiring pattern on the substrate at the same time.

It is to be noted that the copper plate may be a plate shaped member made of material having the same electrical characteristic and mechanical characteristic as those of copper, and the copper connector may be a connector made of material having the same electrical characteristic and mechanical characteristic as those of copper. However, it is preferred to use a copperplate and copper connector since they have industrially stable quality and are available at a relatively low price.

Further, in the above semiconductor module, the bare-chip transistor is preferably a bare-chip FET having a source electrode and a gate electrode formed on a top surface thereof, the copper connector preferably includes a source electrode copper connector and a gate electrode copper connector, the source electrode of the bare-chip FET and the another wiring pattern out of the plurality of wiring patterns are preferably jointed by the source electrode copper connector via a solder, and the gate electrode of the bare-chip FET and a further another wiring pattern out of the plurality of wiring patterns is preferably jointed by the gate electrode copper connector via a solder.

According to the above semiconductor module, the source electrode of the bare-chip FET and the one wiring pattern on the substrate can be jointed by solder mounting operation by use of the source electrode copper connector, and the gate electrode of the bare-chip FET and the another wiring pattern on the substrate can be jointed by solder mounting operation by use of the gate electrode copper connector. Therefore, it is possible to make the joint between the source electrode of the bare-chip FET and the one wiring pattern on the substrate and the joint between the gate electrode of the bare-chip FET and the another wiring pattern on the substrate, in the same process of solder mounting operation for mounting the bare-chip FET or other surface mounting devices on the wiring patterns on the substrate.

Further, in the above semiconductor module, the gate electrode copper connector falls into one type, and the source electrode copper connector falls into two types including a first source electrode copper connector arranged 180 degrees straightly with respect to the gate electrode copper connector, and a second source electrode copper connector arranged 90 degrees perpendicularly with respect to the gate electrode copper connector, and the one type of the gate electrode copper connector and the source electrode copper connector selected from either of the two types including the first source electrode copper connector or the second source electrode copper connector are preferably used in combination with each other on one bare-chip FET.

According to the above semiconductor module, flexibility of arranging the bare-chip transistor mounted on the substrate is created and flexibility of design of wiring on the substrate is increased, thus the layout of the semiconductor module on the substrate can be compact. And in addition, it is easy to uniform length of paths on the substrate for phases of a three-phase motor. This makes it easy to conform characteristics of the phases of the three-phase motor, especially the impedance characteristics of the phases, thereby improving ripple accuracy of torque, velocity and so on.

Further, in the above semiconductor module, the gate electrode and the source electrode formed on the top surface of the bare-chip FET may be arranged straightly in series, and the source electrode may be formed to have a rectangle shape.

Further, in the above semiconductor module, the first source electrode copper connector is preferably led out in a direction that a short side of the source electrode extends, the source electrode being formed to have the rectangle shape with the short side and a long side, and preferably comprises a jointing portion having a short side and a long side corresponding to the short side and the long side of the source electrode, respectively, and an area of a joint surface of the jointing portion is preferably substantially equal to an area of the source electrode, the joint surface being jointed to the source electrode.

According to the above semiconductor module, it is possible to ensure the joint reliability between the source electrode formed on the top surface of the bare-chip FET and the first source electrode copper connector arranged 180 degrees straightly with respect to the gate electrode copper connector.

Further, in the above semiconductor module, the second source electrode copper connector is preferably led out in a direction that a long side of the source electrode extends, the source electrode being formed to have the rectangle shape with a short side and the long side, and preferably comprises a jointing portion having a long side and a short side corresponding to the long side and the short side of the source electrode, respectively, and an area of a joint surface of the jointing portion is preferably substantially equal to an area of the source electrode, the joint surface being jointed to the source electrode.

According to the above semiconductor module, it is possible to ensure the joint reliability between the source electrode formed on the top surface of the bare-chip FET and the second source electrode copper connector arranged 90 degrees perpendicularly with respect to the gate electrode copper connector.

Further, according to another aspect of the present invention, there is provided a method for manufacturing a semiconductor module comprising the steps of: forming an insulating layer on a substrate made of metal; forming a plurality of wiring patterns on the insulating layer; applying solder paste on the plurality of wiring patterns; mounting a bare-chip transistor on the solder paste applied on one wiring pattern out of the plurality of wiring patterns; applying solder paste on an electrode formed on a top surface of the bare-chip transistor; configuring a semiconductor module intermediate assembly by mounting a copper connector constituted of a copper plate on the solder paste applied on the electrode of the bare-chip transistor and on the solder paste applied on another wiring pattern out of the plurality of wiring patterns; and putting the semiconductor module intermediate assembly in a reflow furnace to form a joint between the one wiring pattern out of the plurality of wiring patterns and the bare-chip transistor via a solder, a joint between the electrode formed on the top surface of the bare-chip transistor and the copper connector via a solder, and a joint between the another wiring pattern out of the plurality of wiring patterns and the copper connector via a solder.

According to the above method for manufacturing the semiconductor module, in the same manner as the semiconductor module described above, by using the copper connector constituted of a copper plate, the electrode of the bare-chip transistor and the wiring pattern on the substrate can be jointed by solder mounting operation. Therefore, it is possible to joint the electrode of the bare-chip transistor and the wiring pattern on the substrate in the same process of solder mounting operation for mounting the bare-chip transistor or other surface mounting devices on the wiring patterns on the substrate. This allows to shorten the manufacturing takt time of the semiconductor module, and in addition, eliminates the need for the dedicated equipment for wire bonding, thereby reducing the manufacturing cost of the semiconductor module.

Further, in the above method for manufacturing the semiconductor module, the bare-chip transistor is preferably a bare-chip FET having a source electrode and a gate electrode formed on a top surface thereof, the copper connector preferably includes a source electrode copper connector and a gate electrode copper connector, and wherein the method preferably comprises the steps of: forming the insulating layer on the substrate made of metal; forming the plurality of wiring patterns on the insulating layer; applying the solder paste on the plurality of wiring patterns; mounting the bare-chip FET on the solder paste applied on the one wiring pattern out of the plurality of wiring patterns; applying solder paste on the source electrode and the gate electrode formed on the top surface of the bare-chip FET; mounting the source electrode copper connector on the solder paste applied on the source electrode of the bare-chip FET and on the solder paste applied on the another wiring pattern out of the plurality of wiring patterns; configuring the semiconductor module intermediate assembly by mounting the gate electrode copper connector on the solder paste applied on the gate electrode of the bare-chip FET and on the solder paste applied on a further another wiring pattern out of the plurality of wiring patterns; and putting the semiconductor module intermediate assembly in the reflow furnace to form a joint between the one wiring pattern out of the plurality of wiring patterns and the bare-chip FET via a solder, a joint between the source electrode formed on the top surface of the bare-chip FET and the source electrode copper connector via a solder, and a joint between the another wiring pattern out of the plurality of wiring patterns and the source electrode copper connector via a solder, a joint between the gate electrode formed on the top surface of the bare-chip FET and the gate electrode copper connector via a solder, and a joint between the further another wiring pattern out of the plurality of wiring patterns and the gate electrode copper connector via a solder.

According to the above method for manufacturing the semiconductor module, in the same manner as the semiconductor module described above, the source electrode of the bare-chip FET and the one wiring pattern on the substrate can be jointed by solder mounting operation by use of the source electrode copper connector, and the gate electrode of the bare-chip FET and the another wiring pattern on the substrate can be jointed by solder mounting operation by use of the gate electrode copper connector. Therefore, it is possible to make the joint between the source electrode of the bare-chip FET and the one wiring pattern on the substrate and the joint between the gate electrode of the bare-chip FET and the another wiring pattern on the substrate, in the same process of solder mounting operation for mounting the bare-chip FET or other surface mounting devices on the wiring patterns on the substrate.

Further, in the above method for manufacturing the semiconductor module, the gate electrode copper connector falls into one type, and the source electrode copper connector falls into two types including a first source electrode copper connector arranged 180 degrees straightly with respect to the gate electrode copper connector, and a second source electrode copper connector arranged 90 degrees perpendicularly with respect to the gate electrode copper connector, and the one type of the gate electrode copper connector and the source electrode copper connector selected from either of the two types including the first source electrode copper connector or the second source electrode copper connector are preferably used in combination with each other on one bare-chip FET.

According to the above method for manufacturing the semiconductor module, in the same manner as the semiconductor module described above, flexibility of arranging the bare-chip transistor mounted on the substrate is created and flexibility of design of wiring on the substrate increased, thus the layout of the semiconductor module on the substrate can be compact. And in addition, it is easy to uniform length of paths on the substrate for phases of a three-phase motor. This makes it easy to conform characteristics of the phases of the three-phase motor, especially the impedance characteristics of the phases, thereby improving ripple accuracy of torque, velocity and so on.

Further, according to another aspect of the present invention, there is provided a semiconductor module comprising a joint between an electrode of a bare-chip transistor and a wiring pattern on a substrate made by solder mounting operation by use of a copper connector constituted of copper.

Further, according to another aspect of the present invention, there is provided a semiconductor module characterized in that one type of gate electrode copper connector and a source electrode copper connector selected from either of two types including a first source electrode copper connector arranged 180 degrees straightly with respect to the gate electrode copper connector or a second source electrode copper connector arranged 90 degrees perpendicularly with respect to the gate electrode copper connector are used in combination with each other on one bare-chip FET, such that flexibility of arranging a bare-chip transistor mounted on a substrate is created, and flexibility of design of wiring on the substrate is increased, thus layout of the semiconductor module on the substrate can be compact.

Advantageous Effects of the Invention

According to a semiconductor module and a method for manufacturing the semiconductor module of the present invention, by using the copper connector constituted of a copper plate, the electrode of the bare-chip transistor and the wiring pattern on the substrate can be jointed by solder mounting operation. Therefore, it is possible to joint the electrode of the bare-chip transistor and the wiring pattern on the substrate in the same process of solder mounting operation for mounting the bare-chip transistor or other surface mounting devices on the wiring patterns on the substrate. This allows to shorten the manufacturing takt time of the semiconductor module, and in addition, eliminates the need for the dedicated equipment for wire bonding, thereby reducing the manufacturing cost of the semiconductor module.

In addition, in the above semiconductor module and the above method of manufacturing the semiconductor module, when using the one type of the gate electrode copper connector and the source electrode copper connector selected from either of the two types including the first source electrode copper connector or the second source electrode copper connector in combination with each other on one bare-chip FET, flexibility of arranging the bare-chip transistor mounted on the substrate is created and flexibility of design of wiring on the substrate is increased, thus the layout of the semiconductor module on the substrate can be compact. In addition, it is easy to uniform length of paths on the substrate for phases of a three-phase motor. This makes it easy to conform characteristics of the phases of the three-phase motor, especially the impedance characteristics of the phases, thereby improving ripple accuracy of torque, velocity and so on.

DESCRIPTION OF EMBODIMENTS

Figure 1:
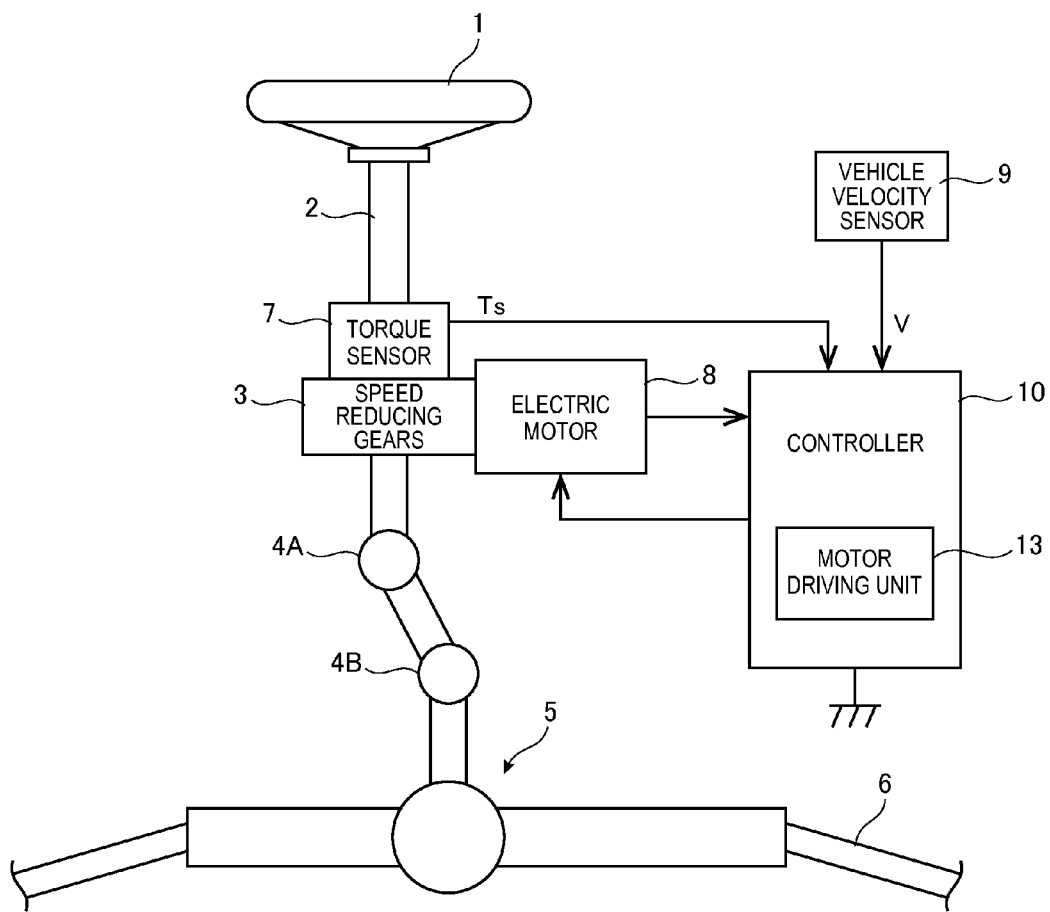
FIG. 1 is a view illustrating a basic structure of an electric power steering apparatus using a semiconductor module according to the present invention.
Figure 2:
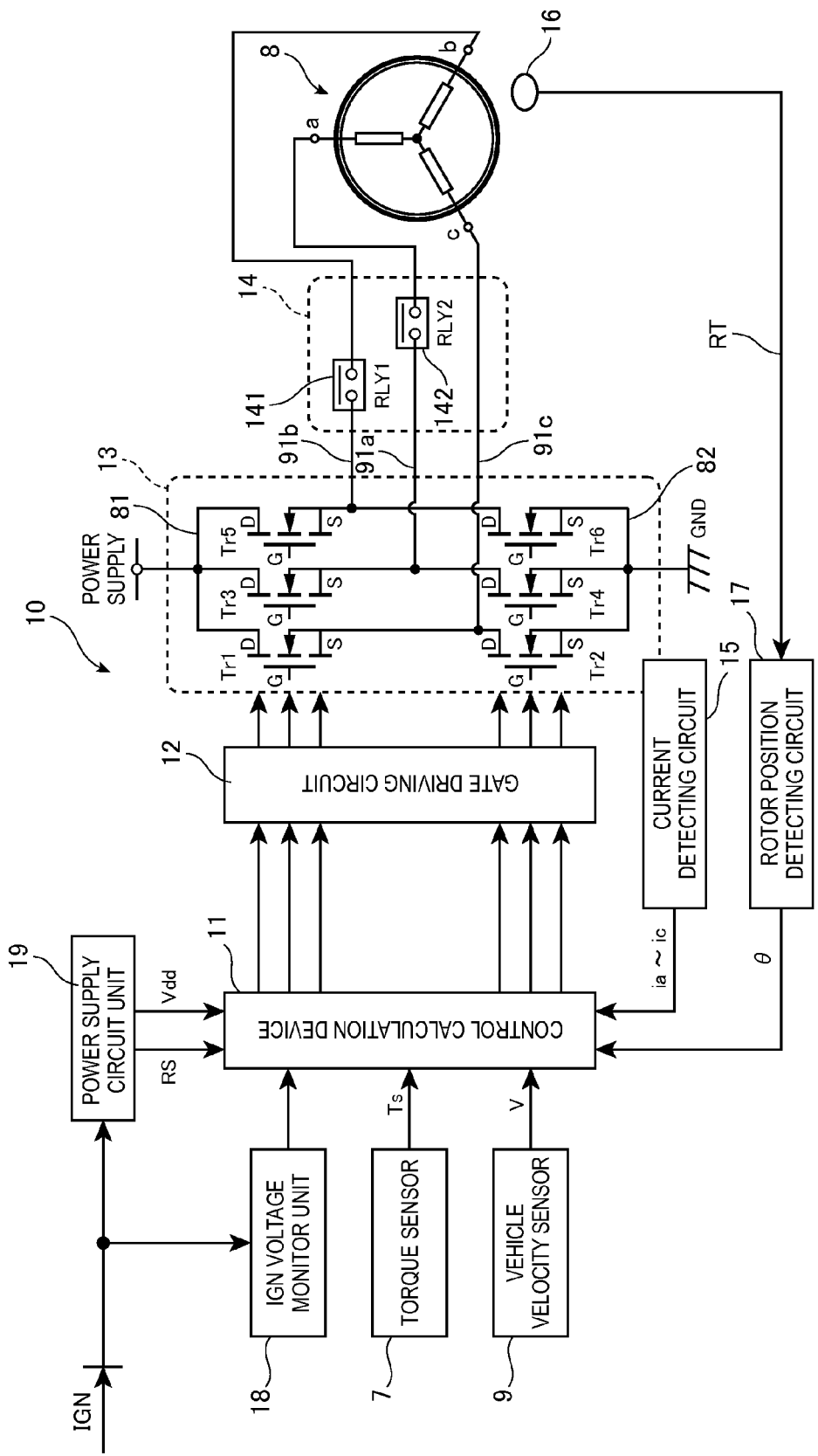
FIG. 2 is a block diagram illustrating a control system of a controller of the electric power steering apparatus illustrated in FIG. 1.
Figure 3:
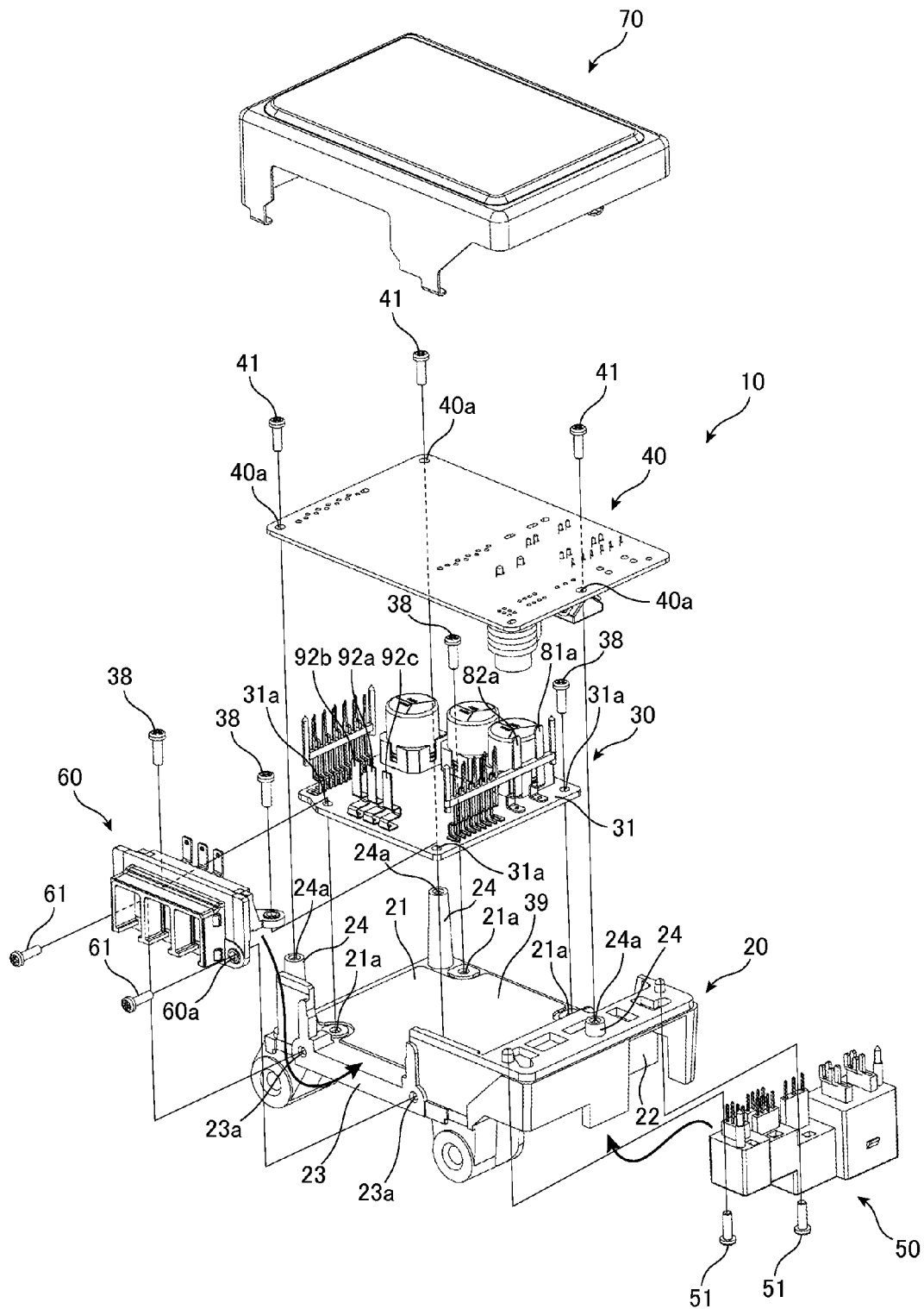
FIG. 3 is an exploded perspective view of the controller including the semiconductor module of the electric power steering apparatus illustrated in FIG. 1.
Figure 4:
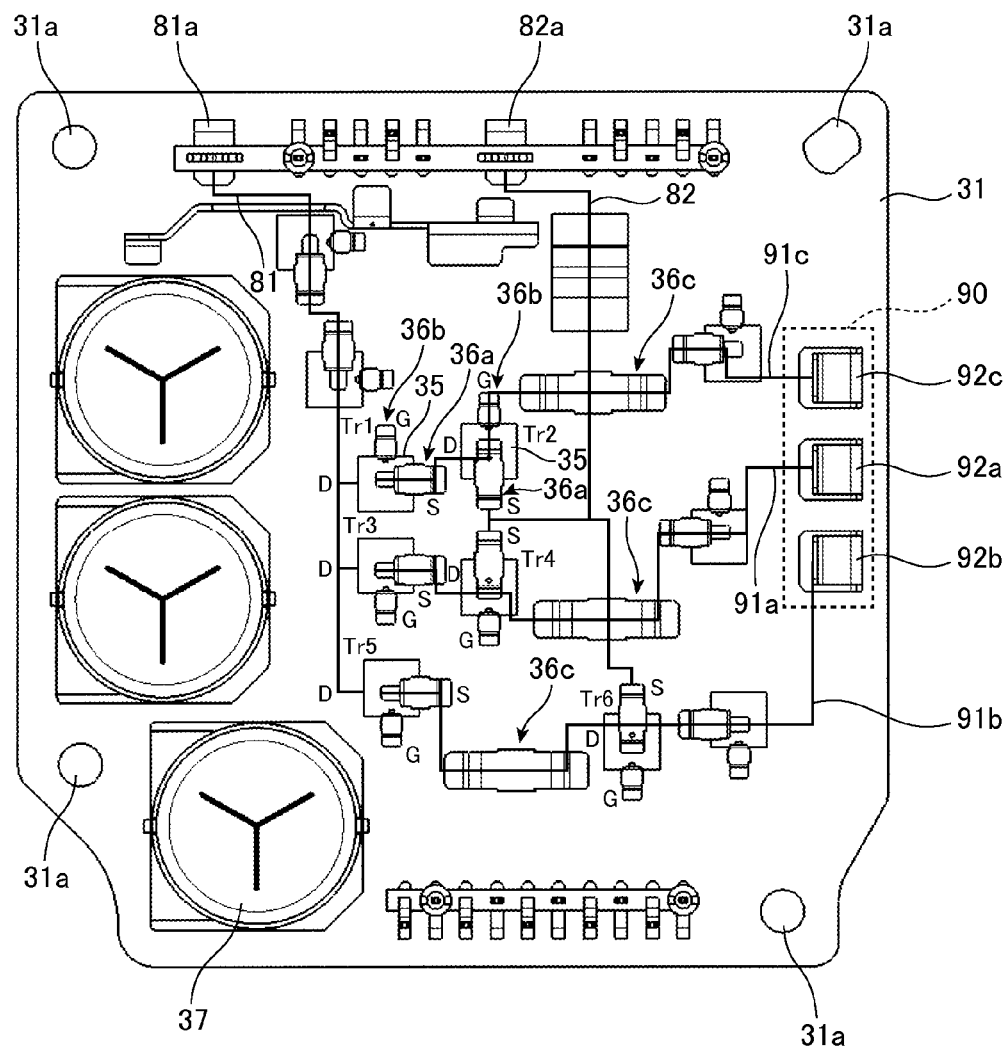
FIG. 4 is a plane view of the semiconductor module illustrated in FIG. 3.
Figure 5:
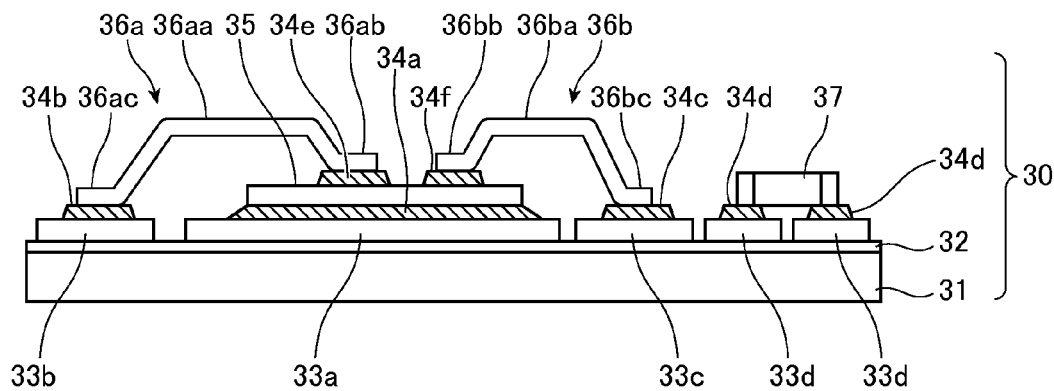
FIG. 5 is a schematic view illustrating the joint state between the wiring pattern on the substrate and the electrode of the bare-chip FET constituting the bare-chip transistor in the semiconductor module illustrated in FIG. 3 and FIG. 4.
Figure 6A:
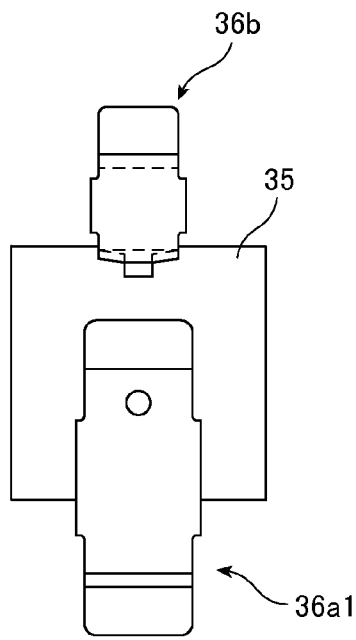
FIG. 6A is a plane view illustrating the joint state between the electrode of the bare-chip FET and the copper connector, in the case where the gate electrode copper connector is jointed to the gate electrode of the bare-chip FET as well as the first source electrode copper connector is jointed to the source electrode.
Figure 6B:
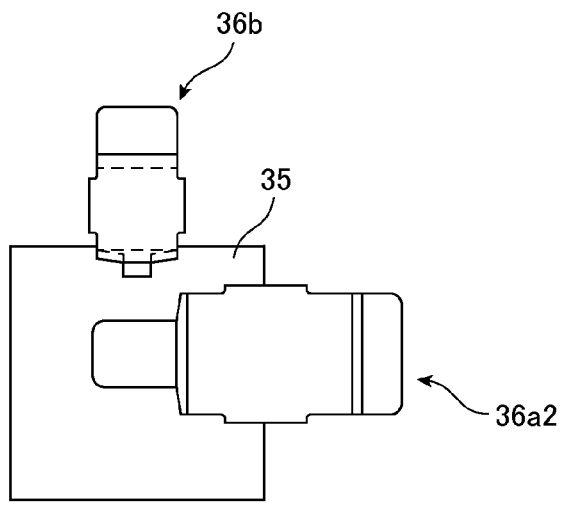
FIG. 6B is a plane view illustrating the connection state between the electrode of the bare-chip FET and the copper connector, in the case where the gate electrode copper connector is jointed to the gate electrode of the bare-chip FET as well as the second source electrode copper connector is jointed to the source electrode.
Figure 7:
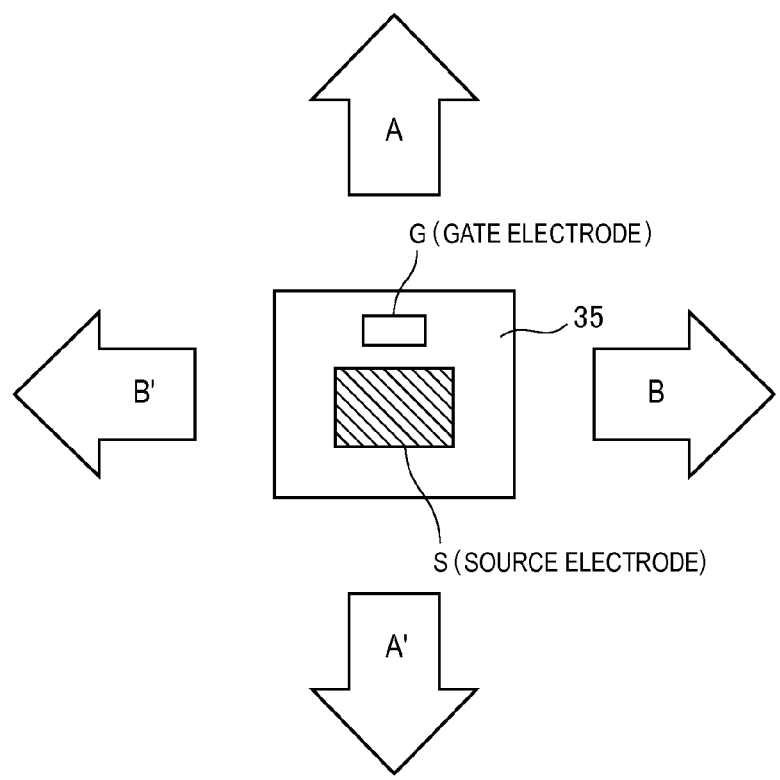
FIG. 7 is a schematic plan view of the bare-chip FET.
Figure 8A:
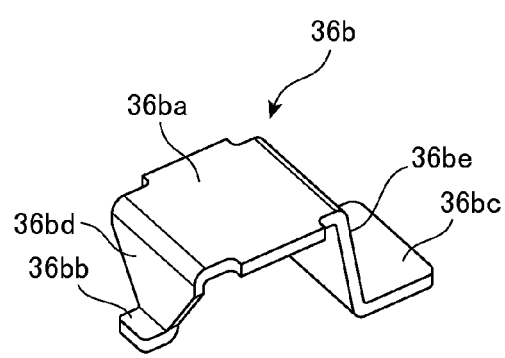
FIG. 8A is a perspective view of the gate electrode copper connector when the left side of the gate electrode copper connector is viewed from obliquely above.
Figure 8B:
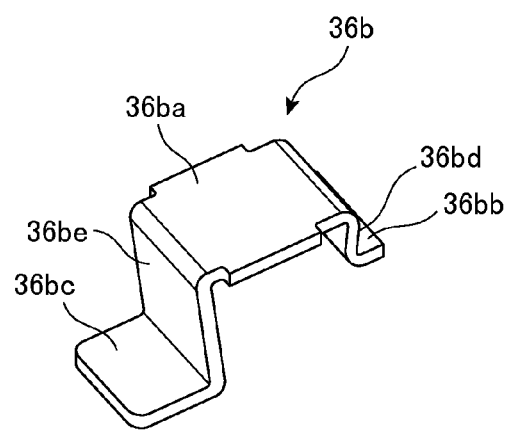
FIG. 8B is a perspective view of the gate electrode copper connector when the right side of the gate electrode copper connector is viewed from obliquely above.

Hereinafter, embodiments of the present invention will be described with reference to the drawings. FIG. 1 is a view illustrating a basic structure of an electric power steering apparatus using a semiconductor module according to the present invention. FIG. 2 is a block diagram illustrating a control system of a controller of the electric power steering apparatus illustrated in FIG. 1. FIG. 3 is an exploded perspective view of the controller including the semiconductor module of the electric power steering apparatus illustrated in FIG. 1. FIG. 4 is a plane view of the semiconductor module illustrated in FIG. 3. FIG. 5 is a schematic view illustrating the joint state between the wiring pattern on the substrate and the electrode of the bare-chip FET constituting the bare-chip transistor in the semiconductor module illustrated in FIG. 3 and FIG. 4. FIG. 6A is a plane view illustrating the joint state between the electrode of the bare-chip FET and the copper connector, in the case where the gate electrode copper connector is jointed to the gate electrode of the bare-chip FET as well as the first source electrode copper connector is jointed to the source electrode. FIG. 6B is a plane view illustrating the connection state between the electrode of the bare-chip FET and the copper connector, in the case where the gate electrode copper connector is jointed to the gate electrode of the bare-chip FET as well as the second source electrode copper connector is jointed to the source electrode. FIG. 7 is a schematic plan view of the bare-chip FET.

In FIG. 1, a basic structure of an electric power steering apparatus using a semiconductor module according to the present invention is illustrated. In the electric power steering apparatus, a column shaft 2 of a steering wheel 1 is connected to tie rod 6 of a steered wheel through a speed reducing gears 3, universal joints 4A and 4B, and a rack and pinion mechanism 5. The column shaft 2 is provided with a torque sensor 7 for detecting the steering torque of the steering wheel 1, an electric motor 8 for assisting the steering force of the steering wheel 1 is connected to the column shaft 2 through the speed reduction gears 3. Electric power is supplied from a battery, not illustrated, to a controller 10 for controlling the electric power steering apparatus and an ignition key signal IGN (see FIG. 2) is inputted into the controller 10 through an ignition key, not illustrated. The controller 10 calculates a steering assisting command value as an assist (steering assisting) command base on a steering torque Ts detected by the torque sensor 7 and a vehicle velocity V detected by a vehicle velocity sensor 9, and controls a current supplied to the electric motor 8 based on the calculated steering assisting command value.

The controller 10 is mainly constituted of a micro computer, and the mechanism and configuration of the controlling apparatus are illustrated in FIG. 2.

The steering torque Ts detected by the torque sensor 7 and the vehicle velocity V detected by the vehicle velocity sensor 9 are inputted to a control calculation device 11 as a control calculation unit, and a current command value calculated by the control calculation device 11 is inputted to a gate driving circuit 12. A gate driving signal formed by the gate driving circuit 12 based on the current command value is inputted to a motor driving unit 13 including a bridge configuration of FETs. The motor driving unit 13 drives the electric motor 8 constituted of a three-phase brushless motor, through a breaker device 14 for emergency stop. Each of phase currents of the three-phase brushless motor is detected by a current detecting circuit 15. The detected three-phase motor currents ia to ic are inputted to the control calculation device 11 as feedback currents. In addition, the three-phase brushless motor is equipped with a rotation sensor 16 such as a Hall sensor, a rotation signal RT from the rotation sensor 16 is inputted to a rotor position detecting circuit 17, and the detected rotation position θ is inputted to the control calculation device 11.

In addition, the ignition signal IGN from the ignition key is inputted into an ignition voltage monitor unit 18 and a power supply circuit unit 19. Power supply voltage Vdd from the power supply circuit unit 19 is inputted to the control calculation device 11, and a reset signal Rs for stopping the apparatus is inputted to the control calculation device 11. Then, the breaker device 14 is constituted of relay contacts 141 and 142 for breaking two phases.

The circuit configuration of the motor driving unit 13 will be described. A serial connection of FETs Tr1 and Tr2, a serial connection of FETs Tr3 and Tr4, and a serial connection of FETs Tr5 and Tr6 are connected to a power-supply line 81, in such a manner that these serial connections are connected in parallel with one another. The serial connection of FETs Tr1 and Tr2, the serial connection of FETs Tr3 and Tr4, and the serial connection of FETs Tr5 and Tr6, which are connected to the power-supply line 81 in such a manner that these serial connections are connected in parallel with one another, are connected a ground line 82. Such a configuration constitutes an inverter. In such a configuration, the source electrode S of the FET Tr1 and the drain electrode D of the FET Tr2 are connected in series, and the FFTs Tr1 and Tr2 constitute a c-phase arm of the three-phase motor and output a current at a c-phase output line 91c. In addition, the source electrode S of the FET Tr3 and the drain electrode D of the FET Tr4 are connected in series, and the FFTs Tr3 and Tr4 constitute an a-phase arm of the three-phase motor and output a current at an a-phase output line 91a. Furthermore, the source electrode S of the FET Tr5 and the drain electrode D of the FET Tr6 are connected in series, and the FFTs Tr5 and Tr6 constitute a b-phase arm of the three-phase motor and output b current at a b-phase output line 91b.

Next, FIG. 3 is an exploded perspective view of the controller 10 including the semiconductor module of the electric power steering apparatus illustrated in FIG. 1. The controller 10 is provided with: a case 20; a semiconductor module 30 as a power module including the motor driving unit 13; a heat dissipation sheet 39; a control circuit substrate 40 including the control calculation device 11 and the gate driving circuit 12; a power/signal connector 50; a three-phase output connector 60; and a cover 70.

In this situation, the case 20 is formed to have a substantially rectangular shape, and provided with a tabular semiconductor module placement portion 21 on which the semiconductor module 30 is placed; and a power/signal connector mounting portion 22 arranged on an end part in a length direction of the semiconductor module placement portion 21, on which the power/signal connector 50 is mounted; and a three-phase output connector mounting portion 23 arranged on an end part in a width direction of the semiconductor module placement portion 21, on which the three-phase output connector 60 is mounted.

A plurality of screw holes 21a are formed on the semiconductor module placement portion 21, and an attachment screw 38 for attaching the semiconductor module 30 is screwed into the screw hole 21a. In addition, the semiconductor module placement portion 21 and the power/signal connector mounting portion 22 are provided with a plurality of attaching posts 24 vertically standing for attaching the control circuit substrate 40. Screw holes 24a are formed on the attaching post 24, and an attachment screw 41 for attaching the control circuit substrate 40 is screwed into the screw hole 24a. Furthermore, a plurality of screw holes 23a are formed on the three-phase output connector mounting portion 23, and an attachment screw 61 for attaching the three-phase output connector 60 is screwed into the screw hole 23a.

In addition, the semiconductor module 30 is provided with the circuit configuration of the motor driving unit 13 described above. As illustrated in FIG. 4, the six FETs Tr1 to Tr6, a positive electrode terminal 81a connected to the power-supply line 81, and a negative electrode terminal 82a connected to the ground line 82, are mounted on a substrate 31. In addition, a three-phase output portion 90 including an a-phase output terminal 92a connected to the a-phase output line 91a, a b-phase output terminal 92b connected to the b-phase output line 91b, and a c-phase output terminal 92c connected to the c-phase output line 91c, are mounted on the substrate 31. In addition, other surface mounting devices 37 including a capacitor are mounted on the substrate 31. Furthermore, a plurality of through-holes 31a are formed on the substrate 31 of the semiconductor module 30, and an attachment screw 38 for attaching the semiconductor module 30 is inserted into the through-hole 31a.

In this situation, the mounting of the six FTTs Tr1 to Tr6 on the substrate 31 in the semiconductor module 30 will be described. Each of the FTTs Tr1 to Tr6 is constituted of a bare-chip FET (bare-chip transistor) 35, and is provided with a source electrode S and a gate electrode G on the bare-chip FET 35, as illustrated in FIG. 7, and is provided with a drain electrode, not illustrated, on the lower surface of the bare-chip FET 35.

The gate electrode G and source electrode S formed on the top surface of the bare-chip FET 35 are arranged straightly in series in up-down direction of FIG. 7, as illustrated in FIG. 7. The gate electrode G is formed to have a rectangle shape, the short side thereof extending in up-down direction of FIG. 7, and the long side thereof being orthogonal to the short side. In addition, the gate electrode S is formed to have a rectangle shape, the short side thereof extending in up-down direction of FIG. 7, and the long side thereof being orthogonal to the short side. The short side and the long side of the source electrode S is longer than the short side and the long side of the gate electrode G, and the area of the source electrode S is lager than the area of the gate electrode G.

The semiconductor module 30 is provided with the substrate 31 made of metal as illustrated in FIG. 5, and an insulating layer 32 is formed on the substrate 31. The substrate 31 is made of metal such as aluminum. In addition, a plurality of wiring patterns 33a to 33d are formed on the insulating layer 32. Each of the wiring patterns 33a to 33d are constituted of metal such as copper or aluminum, or alloy containing these kinds of metal. Then, the bare-chip FET 35 constituting each of the FETs Tr1 to Tr6 is mounted on one wiring pattern 33a out of the plurality of wiring patterns 33a to 33d via a solder 34a. The drain electrode formed on the lower surface of the bare-chip FET 35 is jointed to the wiring pattern 33a via the solder 34a. Then, the top of the source electrode S of the bare-chip FET 35 and the top of another wiring pattern 33b out of the plurality of wiring patterns 33a to 33d are jointed by a source electrode copper connector 36a via solders 34e, 34b. In addition, the top of the gate electrode G of the bare-chip FET 35 and the top of a further another wiring pattern 33c out of the plurality of wiring patterns 33a to 33d are jointed by a gate electrode copper connector 36b via solders 34f, 34c.

In this situation, there is one type of the gate electrode copper connector 36b. In all of the FETs Tr1 to Tr6 illustrated in FIG. 4, the gate electrode copper connector 36b is jointed and led out in a direction of an arrow A illustrated in FIG. 7. Such a situation is illustrated in FIG. 6A and FIG. 6B.

In addition, there are two types of source electrode copper connectors 36a constituted of a first source electrode copper connector 36a1 arranged 180 degrees straightly with respect to the gate electrode copper connector 36b as illustrated in FIG. 6A, and a second source electrode copper connector 36a2 arranged 90 degrees perpendicularly with respect to the gate electrode copper connector 36b as illustrated in FIG. 6B. Then, in the FETs Tr2, Tr4 and Tr6 illustrated in FIG. 4, the first source electrode copper connector 36a1 is jointed and led out in a direction of an arrow A' illustrated in FIG. 7. In addition, in the FET Tr1 in FIG. 4, the second source electrode copper connector 36a2 is jointed and led out in a direction of an arrow B illustrated in FIG. 7. In the FETs Tr3 and Tr5 in FIG. 4, the second source electrode copper connector 36a2 is jointed and led out in a direction of an arrow B' illustrated in FIG. 7.

In this way, the one type of the gate electrode copper connector 36b and the source electrode copper connector selected from either of two types including the first source electrode copper connector 36a1 or the second source electrode copper connector 36a2 are used in combination with each other on one bare-chip FET 35.

Therefore, flexibility of arranging the bare-chip FET 35 mounted on the substrate 31 is created and flexibility of design of wiring on the substrate 31 is increased, thus the layout of the semiconductor module 30 on the substrate 31 can be compact. In addition, it is easy to uniform length of paths (length of the a-phase output line 91a, length of the a-phase output line 91b, and length of the c-phase output line 91c) on the substrate 31 for phases of a three-phase motor. This makes it easy to conform characteristics of the phases of the three-phase motor, especially the impedance characteristics, thereby improving ripple accuracy of torque, velocity and so on.

In this situation, the shape of the gate electrode copper connector 36b will be described specifically, with reference to FIG. 5, FIG. 8A, FIG. 8B, FIG. 9A, FIG. 9B, FIG. 9C and FIG. 9D.

The gate electrode copper connector 36b is formed by punching and bending a copper plate, and is provided with: a flat plate portion 36ba; a jointing portion 36bb extending from one end of the flat plate portion 36ba and jointed to the gate electrode G of the bare-chip FET 35 via the solder 34f; and a jointing portion 36bc extending from another end of the flat plate portion 36ba and jointed to the wiring pattern 33c via the solder 34c.

The flat plate portion 36ba of the gate electrode copper connector 36b constitutes a suction surface sucked by a sucker apparatus using air. This allows suction using air through the use of the flat plate portion 36ba.

In addition, the jointing portion 36bb of the gate electrode copper connector 36b is formed at the lower end of a coupling piece 36bd extending obliquely downward from one end of the flat plate portion 36ba, and extending outward. The jointing portion 36bb has a short side and a long side along the short side and the long side of the gate electrode G, and the area of the joint surface thereof jointing to the gate electrode G is substantially equal to the area of the gate electrode G. Since the area of the joint surface of the jointing portion 36bb jointing to the gate electrode G is substantially equal to the area of the gate electrode G, it is possible to ensure the joint reliability between the gate electrode copper connector 36b and the gate electrode G.

Furthermore, the jointing portion 36bc of the gate electrode copper connector 36b is formed at the lower end of a coupling piece 36be extending obliquely downward from another end of the flat plate portion 36ba, and extending outward. The jointing portion 36bc locates lower then the jointing portion 36bb. The area of the joint surface of the jointing portion 36bc jointing to the wiring pattern 33c is larger than the area of the joint surface of the jointing portion 36bb connecting to the gate electrode G.

Figure 9A:
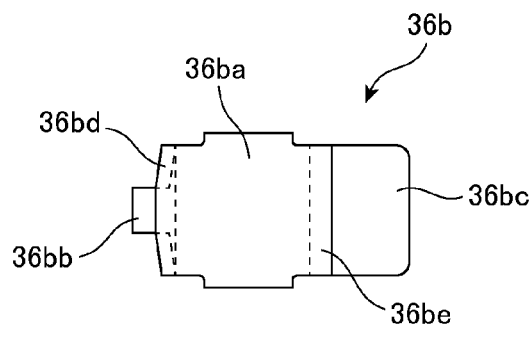
FIG. 9A is a plain view of the gate electrode copper connector.
Figure 9C:
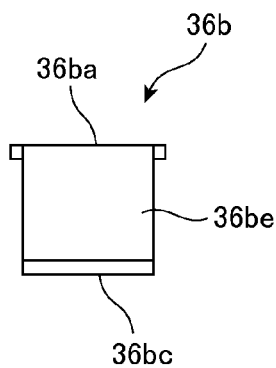
FIG. 9C is a right side view of the gate electrode copper connector.
Figure 9B:
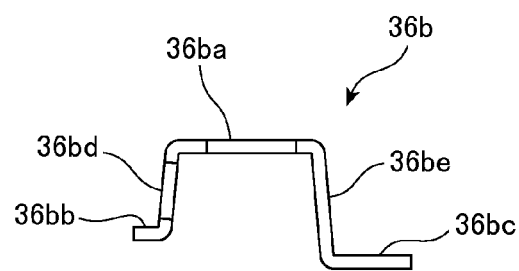
FIG. 9B is a front view of the gate electrode copper connector.
Figure 9D:
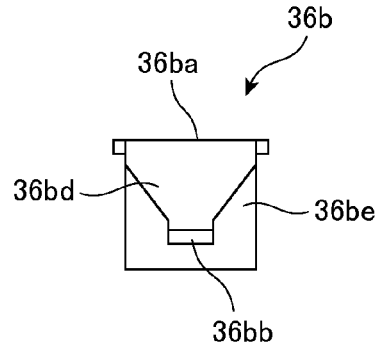
FIG. 9D is a left side view of the gate electrode copper connector.
Figure 10:
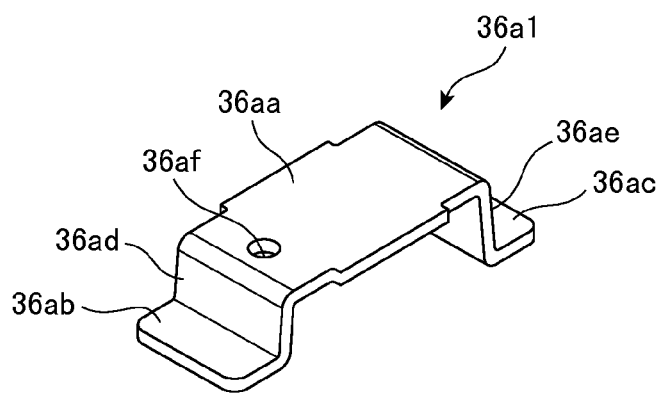
FIG. 10 is a perspective view of the first source electrode copper connector when the left side of the first source electrode copper connector is viewed from obliquely above.

In this way, the gate electrode copper connector 36b is formed to have a substantially lateral U shape when viewed from the front, having the flat plate portion 36ba, the coupling piece 36bd, the jointing portion 36bb, the coupling piece 36be and the jointing portion 36bc, as illustrated in FIG. 9B. Therefore, when the temperature of the gate electrode copper connector 36b becomes high because of the reflow bonding in solder jointing described below and the heat generated by the operation of the semiconductor module 30, the thermal stress is relieved effectively.

In addition, the shape of the first source electrode copper connector 36a1 arranged 180 degrees straightly with respect to the gate electrode copper connector 36b, out of the source electrode copper connector 36a, will be described specifically, with reference to FIG. 5, FIG. 10A, FIG. 10B, FIG. 11A, FIG. 11B, FIG. 11C and FIG. 11D.

The first source electrode copper connector 36a1 is formed by punching and bending a copper plate, and is provided with: a flat plate portion 36aa; a jointing portion 36ab extending from one end of the flat plate portion 36aa and jointed to the source electrode S of the bare-chip FET 35 via the solder 34e; and a jointing portion 36ac extending from another end of the flat plate portion 36aa and jointed to the wiring pattern 33b via the solder 34b.

The flat plate portion 36aa of the first source electrode copper connector 36a1 constitutes a suction surface sucked by a sucker apparatus using air. This allows suction using air through the use of the flat plate portion 36aa. An identification hole 36af distinguishing the first source electrode copper connector 36a1 from the second source electrode copper connector 36a2 is formed on the flat plate portion 36aa.

In addition, the first source electrode copper connector 36a1 is led out in a direction that the short side of the source electrode S extends (direction of the arrow A' illustrated in FIG. 7), the source electrode S being formed to have a rectangle shape. Then, the jointing portion 36ab of the first source electrode copper connector 36a1 is formed at the lower end of a coupling piece 36ad extending obliquely downward from one end of the flat plate portion 36aa, and extending outward. The jointing portion 36ab has a short side and a long side along the short side and the long side of the source electrode S, and the area of the joint surface thereof jointing to the source electrode S is substantially equal to the area of the source electrode S. Since the area of the joint surface of the jointing portion 36ab jointing to the source electrode S is substantially equal to the area of the rectangular source electrode S, it is possible to ensure the joint reliability between the first source electrode copper connector 36a1 arranged 180 degrees straightly with respect to the gate electrode copper connector 36b, and the source electrode S formed on the top surface of the bare-chip FET 35.

Furthermore, the jointing portion 36ac of the first source electrode copper connector 36a1 is formed at the lower end of a coupling piece 36ae extending obliquely downward from another end of the flat plate portion 36aa, and extending outward. The jointing portion 36ac locates lower then the jointing portion 36ab. The area of the joint surface of the jointing portion 36ac jointing to the wiring pattern 33b is substantially equal to the area of the joint surface of the jointing portion 36ab jointing to the source electrode S.

Figure 11A:
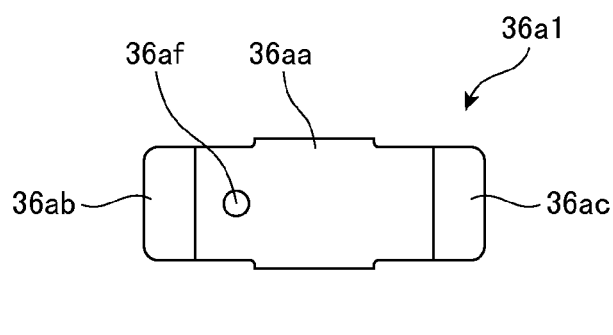
FIG. 11A is a plain view of the first source electrode copper connector.
Figure 11C:
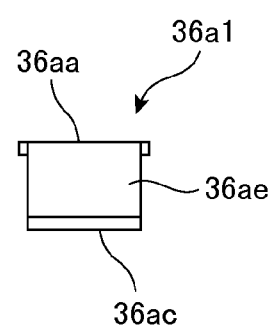
FIG. 11C is a right side view of the first source electrode copper connector.
Figure 11B:
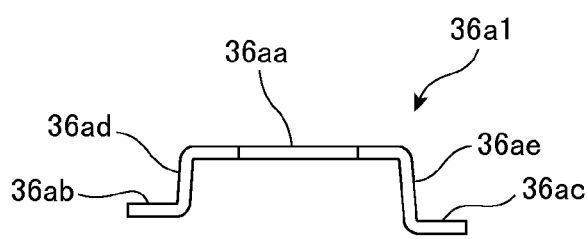
FIG. 11B is a front view of the first source electrode copper connector.
Figure 11D:
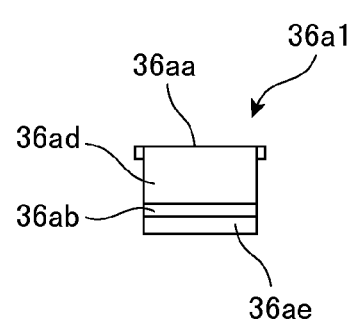
FIG. 11D is a left side view of the first source electrode copper connector.
Figure 12:
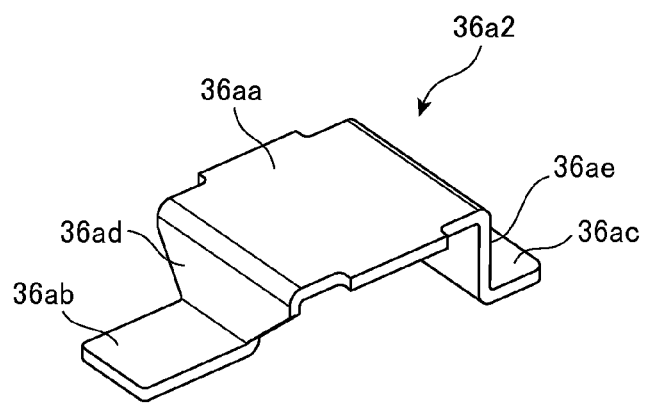
FIG. 12 is a perspective view of the second source electrode copper connector when the left side of the second source electrode copper connector is viewed from obliquely above.

In this way, the first source electrode copper connector 36a1 is formed to have a substantially lateral U shape when viewed from the front, having the flat plate portion 36aa, the coupling piece 36ad, the jointing portion 36ab, the coupling piece 36ae and the jointing portion 36ac, as illustrated in FIG. 11B. Therefore, when the temperature of the first source electrode copper connector 36a1 becomes high because of the reflow bonding in solder jointing described below and the heat generated by the operation of the semiconductor module 30, the thermal stress is relieved effectively.

In addition, the shape of the second source electrode copper connector 36a2 arranged 90 degrees perpendicularly with respect to the gate electrode copper connector 36b, out of the source electrode copper connector 36a, will be described specifically, with reference to FIG. 5, FIG. 12A, FIG. 12B, FIG. 13A, FIG. 13B, FIG. 13C and FIG. 13D.

The second source electrode copper connector 36a2 is formed by punching and bending a copper plate, and is provided with: a flat plate portion 36aa; a jointing portion 36ab extending from one end of the flat plate portion 36aa and jointed to the source electrode S of the bare-chip FET 35 via the solder 34e; and a jointing portion 36ac extending from another end of the flat plate portion 36aa and jointed to the wiring pattern 33b via the solder 34b.

The flat plate portion 36aa of the second source electrode copper connector 36a2 constitutes a suction surface sucked by a sucker apparatus using air. This allows suction using air through the use of the flat plate portion 36aa.

In addition, the second source electrode copper connector 36a2 is led out in a direction that the long side of the source electrode S extends (direction of the arrow B' illustrated in FIG. 7), the source electrode S being formed to have a rectangle shape. Then, the jointing portion 36ab of the second source electrode copper connector 36a2 is formed at the lower end of a coupling piece 36ad extending obliquely downward from one end of the flat plate portion 36aa, and extending outward. The jointing portion 36ab has a short side and a long side along the long side and the short side of the source electrode S, and the area of the joint surface thereof jointing to the source electrode S is substantially equal to the area of the source electrode S. Since the area of the joint surface of the jointing portion 36ab jointing to the source electrode S is substantially equal to the area of the rectangular source electrode S, it is possible to ensure the joint reliability between the second source electrode copper connector 36a2 arranged 90 degrees perpendicularly with respect to the gate electrode copper connector 36b, and the source electrode S formed on the top surface of the bare-chip FET 35.

Furthermore, the jointing portion 36ac of the second source electrode copper connector 36a2 is formed at the lower end of a coupling piece 36ae extending obliquely downward from another end of the flat plate portion 36aa, and extending outward. The jointing portion 36ac locates lower then the jointing portion 36ab. The area of the joint surface of the jointing portion 36ac jointing to the wiring pattern 33b is substantially equal to the area of the joint surface of the jointing portion 36ab jointing to the source electrode S.

Figure 13A:
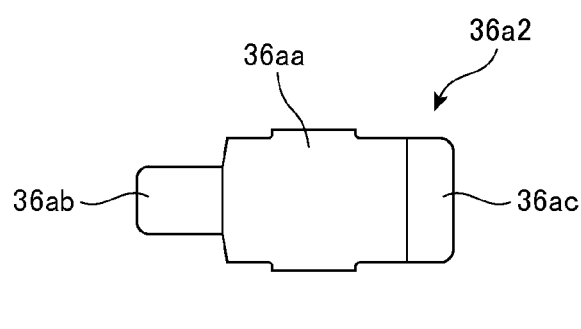
FIG. 13A is a plain view of the second source electrode copper connector.
Figure 13C:
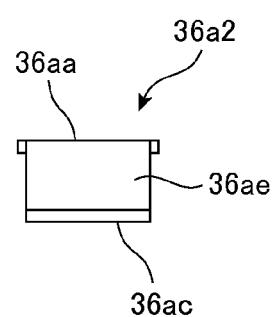
FIG. 13C is a right side view of the second source electrode copper connector.
Figure 13B:
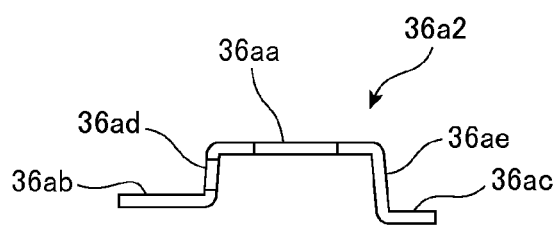
FIG. 13B is a front view of the second source electrode copper connector.
Figure 13D:
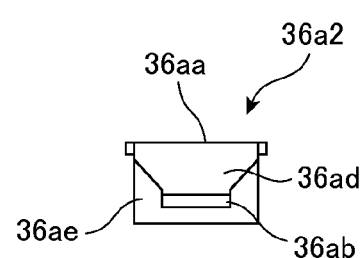
FIG. 13D is a left side view of the second source electrode copper connector.
Figure 14:
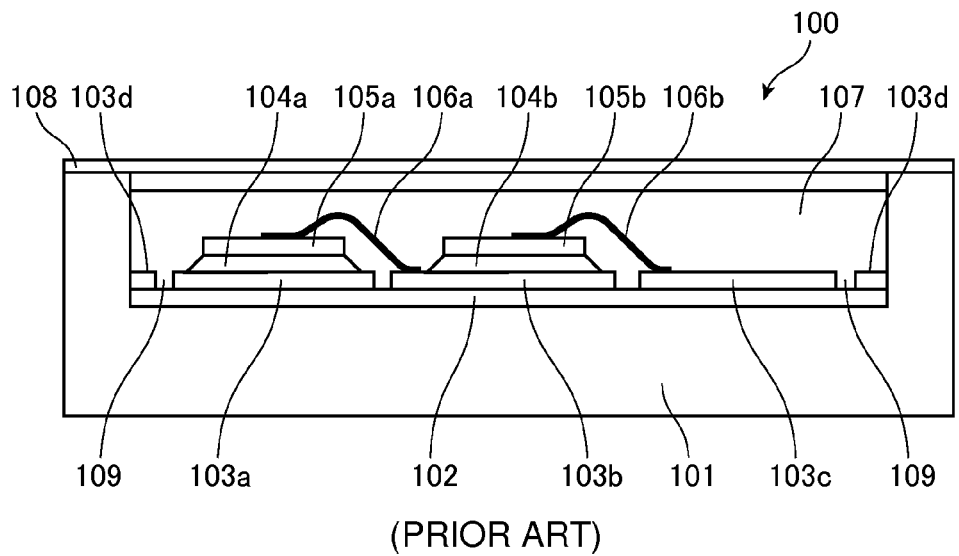
FIG. 14 is across-sectional schematic view of an example of a conventional semiconductor module.
Figure 15:
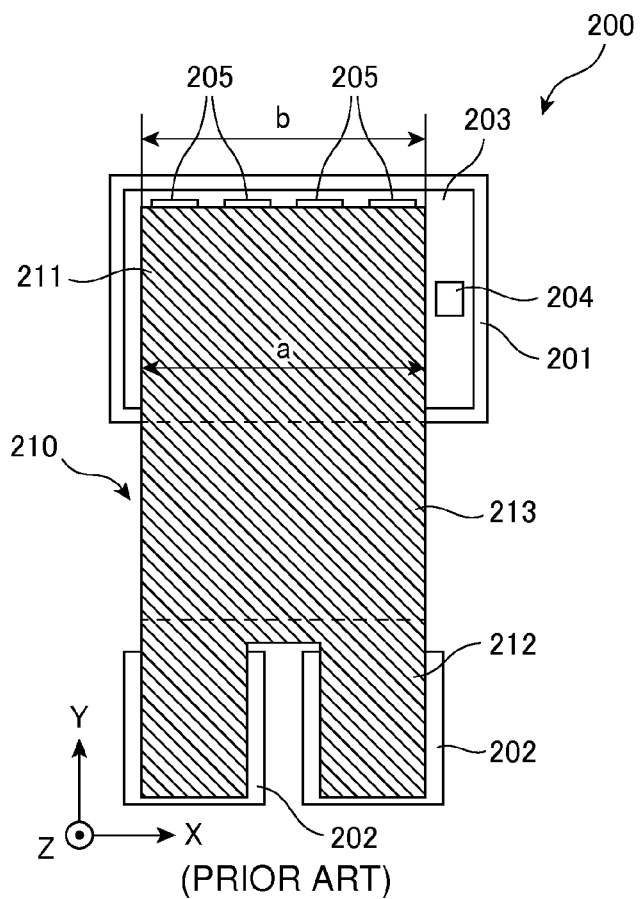
FIG. 15 is a plane schematic view of another example of a conventional semiconductor module.

In this way, the second source electrode copper connector 36a2 is formed to have a substantially lateral U shape when viewed from the front, having the flat plate portion 36aa, the coupling piece 36ad, the jointing portion 36ab, the coupling piece 36ae and the jointing portion 36ac, as illustrated in FIG. 13B. Therefore, when the temperature of the second source electrode copper connector 36a2 becomes high because of the reflow bonding in solder jointing described below and the heat generated by the operation of the semiconductor module 30, the thermal stress is relieved effectively.

In addition, in the semiconductor module 30 illustrated in FIG. 5, the other surface mounting devices 37 such as a capacitor is mounted via the solder 34d on a further another wiring pattern 34*d* out of the plurality of wiring patterns 33*a* to 33*d* formed on the insulating layer 32.

The semiconductor module 30 configured in this manner is attached on the semiconductor module placement portion 21 of the case 20 with the plurality of attachment screw 38, as illustrated in FIG. 3. The plurality of through-holes 31*a* are formed on the substrate 31 of the semiconductor module 30, and the attachment screw 38 is inserted into the through-hole 31*a*.

In addition, when the semiconductor module 30 is attached on the semiconductor module placement portion 21, the heat dissipation sheet 39 is attached on the semiconductor module placement portion 21, the semiconductor module 30 is attached on the top of the heat dissipation sheet 39. By use of the heat dissipation sheet 39, the heat generated at the semiconductor module 30 is dissipated to the case 20 through the heat dissipation sheet 39.

In addition, a control circuit including the control calculation device 11 and the gate driving circuit 12 is configured by mounting a plurality of electronic component on the control circuit substrate 40. After the semiconductor module 30 is attached on the semiconductor module placement portion 21, the control circuit substrate 40 is attached above the semiconductor module 30 and on the plurality of attaching posts 24 vertically standing on the semiconductor module placement portion 21 and the power/signal connector mounting portion 22 with the plurality of attachment screws 41. A plurality of through-holes 40*a* are formed on the control circuit substrate 40, and the attachment screw 41 is inserted into the through-hole 40*a*.

The power/signal connector 50 is used to supply direct-current power from a battery, not illustrated, to the semiconductor module 30, and to input various signals including the signals from the torque sensor 7 and the vehicle velocity sensor 9 to the control circuit substrate 40. The power/signal connector 50 is attached on the power/signal connector mounting portion 22 provided on the semiconductor module placement portion 21 with a plurality of attachment screws 51.

Then, the three-phase output connector 60 is used to output currents from the a-phase output terminal 92*a*, the b-phase output terminal 92*b* and the c-phase output terminal 92*c*. The three-phase output connector 60 is attached on the three-phase output connector mounting portion 23 provided on the end part in a width direction of the semiconductor module placement portion 21 with a plurality of attachment screws 61. A plurality of through-holes 60*a* are formed on the three-phase output connector 60, and the attachment screw 61 is inserted into the through-hole 60*a*.

Furthermore, the cover 70 is attached on the case 20 to which the semiconductor module 30, the control circuit substrate 40, the power/signal connector 50 and the three-phase output connector 60 are attached, in such a manner that the cover 70 covers the top of the control circuit substrate 40.

Next, a method for manufacturing the semiconductor module 30 will be described, with reference to FIG. 5.

In manufacturing the semiconductor module 30, first, the insulating layer 32 is formed on one of principal planes of the substrate 31 made of metal (insulating layer forming step).

Next, the plurality of wiring patterns 33*a* to 33*d* are formed on the insulating layer 32 (wiring pattern forming step).

Then, the solder paste (the solder 34*a* to 34*d*) is applied on the plurality of wiring patterns 33*a* to 33*d*, respectively (solder paste applying step).

Then, one of the bare-chip FET 35 is mounted on the solder paste (the solder 34*a*) applied on the one wiring pattern 33*a* out of the plurality of wiring patterns 33*a* to 33*d* (bare-chip mounting step), as well as the other surface mounting devices 37 is mounted on the solder paste (the solder 34*d*) applied on another wiring pattern 33*d*. Another bare-chip FET 35 is also mounted on the wiring pattern identical to the wiring pattern 33*a* or on another wiring pattern.

Next, the solder paste (the solder 34*e* and 34*f*) is applied on the source electrode S and the gate electrode G formed on the top surface of the bare-chip FET 35 (solder paste applying step).

Then, the source electrode copper connector 36*a* (the source electrode copper connector selected from either of the first source electrode copper connector 36*a*1 or the second source electrode copper connector 36*a*2) is mounted on the solder paste (the solder 34*e*) applied on the source electrode S of the bare-chip FET 35 and the solder paste (the solder 34*b*) applied on the another wiring pattern 33*b* out of the plurality of wiring patterns 33*a* to 33*d* other than the wiring pattern 33*a* on which the bare-chip FET 35 is mounted (source electrode copper connector mounting step).

In addition, the gate electrode copper connector 36*b* is mounted on the solder paste (the solder 34*f*) applied on the gate electrode G of the bare-chip FET 35 and the solder paste (the solder 34*c*) applied on the further another wiring pattern 33*c* out of the plurality of wiring patterns 33*a* to 33*d* other than the wiring pattern 33*a* on which the bare-chip FET 35 is mounted and the wiring pattern 33*b* on which the source electrode copper connector 36*a* is mounted (gate electrode copper connector mounting step). A semiconductor module intermediate assembly is configured in this way.

Then, the semiconductor module intermediate assembly configured through the steps described above is putted in a reflow furnace, not illustrated, and a joint between the one wiring pattern 33*a* out of the plurality of wiring patterns 33*a* to 33*d* and the bare-chip FET 35 via the solder 34*a*, a joint between the wiring pattern 33*d* and the other surface mounting devices 37 via the solder 34*d*, a joint between the source electrode S formed on the top surface of the bare-chip FET 35 and the source electrode copper connector 36*a* via the solder 34*e*, a joint between the another wiring pattern 33*b* out of the plurality of wiring patterns 33*a* to 33*d* and the source electrode copper connector 36*a*, a joint between the gate electrode G formed on the top surface of the bare-chip FET 35 and the gate electrode copper connector 36*b* via the solder 34*f*, and a joint between the further another wiring pattern 33*c* out of the plurality of wiring patterns 33*a* to 33*d* and the gate electrode copper connector 36*b* via the solder 34*c*, are formed collectively (jointing step)

The semiconductor module 30 is completed in this way.

In this situation, the source electrode S of the bare-chip FET 35 and the one wiring pattern 33*b* on the substrate 31 can be jointed by solder mounting operation by use of the source electrode copper connector 36*a*, and the gate electrode G of the bare-chip FET 35 and the another wiring pattern 33*c* on the substrate 31 can be jointed by solder mounting operation by use of the gate electrode copper connector 36*b*. Therefore, it is possible to make the joint between the source electrode S of the bare-chip FET 35 and the one wiring pattern 33*b* on the substrate 31 and the joint between the gate electrode G of the bare-chip FET 35 and the another wiring pattern 33*c* on the substrate 31, in the same process of solder mounting operation for mounting the bare-chip FET 35 or the other surface mounting devices 37 on the wiring patterns 33*a*, 33*d* on the substrate 31. This allows to shorten the manufacturing takt time of the semiconductor module 30, and in addition, eliminates the need for the dedicated equipment for wire bonding, thereby reducing the manufacturing cost of the semiconductor module 30.

Heretofore, embodiments of the present invention have been described. The present invention, however, is not limited to those embodiments, and various modifications and improvements may occur.

For example, the bare-chip FET 35 is used in the semiconductor module 30, instead of the bare-chip FET 35, the semiconductor module 30 may use another type of bare-chip transistor such as a bare-chip IGBT. Then, in the case using another type of bare-chip transistor, a copper connector may be used to joint the top of the electrode formed on the top surface of the bare-chip transistor to another wiring pattern out of a plurality of wiring patterns other than one wiring pattern to which the bare-chip transistor is jointed. In this way, it is possible to joint the electrode of the bare-chip transistor and the wiring pattern on the substrate in the same process of solder mounting operation for mounting the bare-chip transistor or other surface mounting devices on the wiring patterns on the substrate.

In addition, in the case using a bare-chip IGBT as a bare-chip transistor, it is preferred to joint the emitter electrode and gate electrode formed on the bare-chip IGBT to the wiring pattern on the substrate by use of copper connectors via solder.

In the case using a bare-chip IGBT and jointing the emitter electrode and gate electrode formed on the bare-chip IGBT to the wiring pattern on the substrate by use of copper connectors via solder, respectively, in this way, it is possible to joint the emitter electrode of the bare-chip IGBT to one wiring pattern on the substrate and the gate electrode of the bare-chip IGBT to another wiring pattern on the substrate, in the same process of solder mounting operation for mounting the bare-chip IGBT or other surface mounting devices on the wiring patterns on the substrate.

In addition, the source electrode S formed on the top surface of the bare-chip FET 35 is formed to have a rectangle shape, however it may be formed to have a square shape. In this case, it is possible to uniform the shape of the first source electrode copper connector 36a1 and the shape of the second source electrode copper connector 36a2, which are jointed the source electrode S, to commonalize them.

In addition, the common copper connector 36c is used as a jumper line for the a-phase output line 91a, the b-phase output line 91b and the c-phase output line 91c, in the semiconductor module 30 illustrated in FIG. 4. This uniforms length of paths of the a-phase output line 91a, the b-phase output line 91b and the c-phase output line 91c.

REFERENCE SIGNS LIST 1 steering wheel
2 column shaft
3 speed reducing gears
4A, 4B universal joint
5 rack and pinion mechanism
6 tie rod
7 torque sensor
8 electric motor
9 vehicle velocity sensor
10 controller
11 control calculation device
12 gate driving circuit
13 motor driving unit
14 breaker device for emergency stop
15 current detecting circuit
16 rotation sensor
17 rotor position detecting circuit
18 IGN voltage monitor unit
19 power supply circuit unit
20 case
21 semiconductor module placement portion
21a screw hole
22 power/signal connector mounting portion
23 three-phase output connector mounting portion
23a screw hole
24 attaching post
24a screw hole
30 semiconductor module
31 substrate
31a through-hole
32 insulating layer
33a to 33d the wiring pattern
34a to 34d solder
35 bare-chip FET (bare-chip transistor)
36a source electrode copper connector
36a1 first source electrode copper connector
36a2 second source electrode copper connector
36c copper connector
36aa flat plate portion
36ab jointing portion
36ac jointing portion
36ad coupling portion
36ae coupling portion
36af identification hole
36b gate electrode copper connector
36ba flat plate portion
36bb jointing portion
36bc jointing portion
36bd coupling portion
36be coupling portion
37 surface mounting device
38 attachment screw
39 heat dissipation sheet
40 control circuit substrate
40a through-hole
41 attachment screw
50 power/signal connector
51 attachment screw
60 three-phase output connector
60a through-hole
61 attachment screw
70 cover
81 power-supply line
81a positive electrode terminal
82 ground line
82a negative electrode terminal
90 three-phase output portion
91a a-phase output line
91b b-phase output line
91c c-phase output line
G gate electrode (electrode)
S source electrode (electrode)

The invention claimed is:
1. A semiconductor module comprising:
a substrate made of metal;
an insulating layer formed on the substrate;
a plurality of wiring patterns formed on the insulating layer;
a bare-chip transistor mounted on a first wiring pattern out of the plurality of wiring patterns via soldering;
a copper connector constituted of a copper plate for jointing an electrode formed on a top surface of the bare-chip transistor and second wiring pattern out of the plurality of wiring patterns via soldering; and a packaged surface mounting device other than the bare-chip transistor mounted on a third wiring pattern out of the plurality of wiring patterns via soldering, the third wiring pattern being different from the first wiring pattern and the second wiring pattern;

wherein the bare-chip transistor is a bare-chip FET having a source electrode and a gate electrode formed on a top surface thereof;

wherein the copper connector includes a source electrode copper connector and a gate electrode copper connector;

wherein the source electrode of the bare-chip FET and the second wiring pattern are jointed by the source electrode copper connector via soldering;

wherein the gate electrode of the bare-chip FET and a fourth wiring pattern out of the plurality of wiring patterns is jointed by the gate electrode copper connector via soldering;

wherein the gate electrode copper connector falls into one type, and the source electrode copper connector comprises one of two types, the two types including: a first source electrode copper connector arranged 180 degrees straightly with respect to the gate electrode copper connector, and a second source electrode copper connector arranged 90 degrees perpendicularly with respect to the gate electrode copper connector; and wherein the gate electrode copper connector and the source electrode copper connector are used in combination with each other on the same bare-chip FET.

2. The semiconductor module according to claim 1, wherein the gate electrode and the source electrode formed on the top surface of the bare-chip FET are arranged straightly in series, and the source electrode is formed to have a rectangle shape.

3. The semiconductor module according to claim 2,
wherein the first source electrode copper connector is led out in a direction that a short side of the source electrode extends, the source electrode being formed to have the rectangle shape with the short side and a long side, and comprises a first jointing portion having a short side and a long side corresponding to the short side and the long side of the source electrode, respectively; and wherein a size of an area of a joint surface of the first jointing portion is substantially equal to a size of an area of the source electrode, the joint surface being jointed to the source electrode.

4. The semiconductor module according to claim 3,
wherein the second source electrode copper connector is led out in a direction that a long side of the source electrode extends, the source electrode being formed to have the rectangle shape with a short side and the long side, and comprises a second jointing portion having a long side and a short side corresponding to the long side and the short side of the source electrode, respectively; and wherein a size of an area of a joint surface of the second jointing portion is substantially equal to a size of an area of the source electrode, the joint surface being jointed to the source electrode.

5. The semiconductor module according to claim 2,
wherein the second source electrode copper connector is led out in a direction that a long side of the source electrode extends, the source electrode being formed to have the rectangle shape with a short side and the long side, and comprises a jointing portion having a long side and a short side corresponding to the long side and the short side of the source electrode, respectively; and wherein a size of an area of a joint surface of the jointing portion is substantially equal to a size of an area of the source electrode, the joint surface being jointed to the source electrode.

* * * * *